United States Patent
Toyosawa et al.

[11] Patent Number: 6,049,121
[45] Date of Patent: *Apr. 11, 2000

[54] TAPE CARRIER PACKAGE AND LIQUID CRYSTAL DISPLAY DEVICE INCLUDING SUCH TAPE CARRIER PACKAGE

[75] Inventors: Kenji Toyosawa, Ikoma; Takuro Asazu, Nara; Naoyuki Tajima, Yamatokoriyama, all of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/840,066

[22] Filed: Apr. 24, 1997

[30] Foreign Application Priority Data

Apr. 24, 1996 [JP] Japan .................................. 8-102825

[51] Int. Cl.[7] .................................................. H01L 23/495
[52] U.S. Cl. ........................ 257/668; 257/781; 257/782; 257/786
[58] Field of Search .................................... 257/782, 783, 257/780, 781, 786, 668, 787, 72

[56] References Cited

U.S. PATENT DOCUMENTS 5,355,019  10/1994  Fuchs .
5,550,408  8/1996   Kunitomo et al. .
5,598,030  1/1997   Imai et al. .
5,616,958  4/1997   Laine et al. .
5,726,491  3/1998   Tajima et al. .

FOREIGN PATENT DOCUMENTS

64-19752   1/1989   Japan .
7-94553    4/1995   Japan .
7-321244  12/1995   Japan .

*Primary Examiner*—Sheila V. Clark
*Attorney, Agent, or Firm*—Nixon & Vanderhye P.C.

[57] ABSTRACT

A tape carrier package includes a semiconductor chip including a first row of electrode bumps formed on a surface of a semiconductor chip and a second row of electrode bumps formed on the surface of the semiconductor chip parallel to the first row. The tape carrier package also includes an insulating film, at least a portion of the insulating film being formed on the semiconductor chip, a conductor pattern including a first lead section formed on the insulating film and connectable to an external device and a second lead section extending from the first lead section so as to electrically connect to the first and second rows of electrode bumps. At least a part of the first lead section is positioned on the semiconductor chip. A sealing resin is provided for sealing at least a junction between the first and second rows of electrode bumps and the second lead section.

15 Claims, 9 Drawing Sheets

PRIOR ART

FIG.11

PRIOR ART

FIG.12

PRIOR ART

TAPE CARRIER PACKAGE AND LIQUID CRYSTAL DISPLAY DEVICE INCLUDING SUCH TAPE CARRIER PACKAGE

BACKGROUND OF THE INVENTION

1. Field of the Invention

The present invention relates to a tape carrier package and a liquid crystal display device including such a tape carrier package.

2. Description of the Related Art

Figure 10:
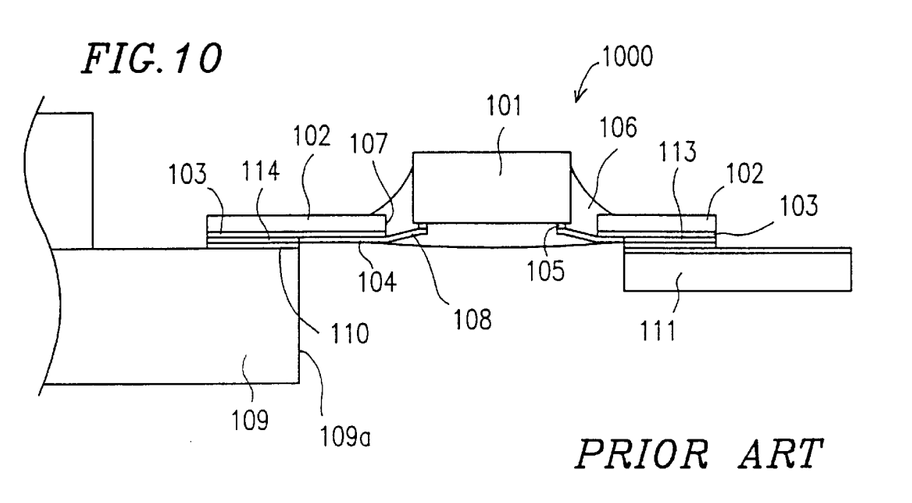
FIG. 10 is a cross-sectional view showing the configuration of a TCP having a conventional structure for driving a liquid crystal display panel, attached to the liquid crystal display panel.

FIG. 10 is a cross-sectional view showing the configuration of a conventional tape carrier package 1000 (hereinafter, referred to as "TCP") for driving a liquid crystal display panel 109.

A method for fabricating the conventional TCP 1000 shown in FIG. 10 is described below First, a semiconductor chip 101 having gold bumps 105 is fabricated by plating electrodes (pads) which are formed on a wafer with gold so as to form gold bumps 105, attaching the resultant water with the bumps 105 onto a dicing sheet, and then dicing the wafer by dicing apparatus into the semiconductor chip 101 having a predetermined size.

Although the size and the height of each of the gold bumps 105 very depending on a bump pitch, the bump size and the bump height are typically within the range of about 40 to 100 $\mu$m and within the range of about 10 to 20 $\mu$m, respectively. In the case of a semiconductor chip for a liquid crystal device driver, the chip has typically an elongated shape with an aspect ratio (i.e., a ratio of length to width) in the range of about 10 to 20.

Then, the semiconductor chip 101 is placed into a device hole 107 of a tape carrier. The tape carrier includes an insulating film 102 made of polyimide or the like as a tape substrate, and a conductor pattern deposited thereon through an adhesive layer 103. The conductor pattern forms inner leads 108, output-side outer leads 114 serving as connection terminals for a liquid crystal device driving signal, and input-side outer leads 113 serving as source terminals for driving the semiconductor chip and as connection terminals for an image signal.

Next, in the inner lead bonding step, the gold bumps 105 on the semiconductor chip 101 and inner leads 108 of the tape carrier are bonded to each other by using an inner lead bonder. When the gold of the gold bumps 105 and tin of the inner leads 108 form an eutectic alloy, the bonding is completed. The inner leads 108 are formed by etching, for example, a copper foil. In order to form the autectic alloy, the surface of the inner lead 108 is plated with a tin layer having a thickness in the range of 0.1 to 0.3 $\mu$m.

Since the semiconductor chip 101 is held by the inner leads 108 after the inner lead bonding step, a sealing liquid resin 106 is applied onto a predetermined area of the semiconductor chip 101 by a plotting method so as to plot the junction portion of the semiconductor chip 101 and the inner leads 108. Then, the liquid resin 106 is cured so as to coat the junction portion of the semiconductor chip 101 and the inner leads 108. The potting cure is carried out at about 100° C. or higher for several hours. After the liquid resin 106 is cured, the resultant TCP 1000 is marked and is then subjected to a final test. Thereafter, the real-shaped TCP 1000 is shipped without performing a further process, or is cut into pieces to be shipped as slide carriers.

The TCP 1000 fabricated by the steps as described above has the structure which is the most advantageous for packaging a semiconductor device having multi-connection terminals into a compact size. Thus, at present, such TCPs are the most widely utilized as carrier packages for a semiconductor device for driving a liquid crystal display panel.

As shown in FIG. 10, the TCP 1000 is preattached to connection terminals provided in the outer peripheral region of the liquid crystal display panel 109 with an anisotropic conductor film 110. Then, the output-side outer lead 114 is aligned with the corresponding connection terminals provided in the outer peripheral region of the liquid crystal display panel 109. The aligned portion is subjected to thermo-compressive bonding using a heated tool so as to attach the TCP 1000 and the liquid crystal display panel 109 to each other. The input-side outer leads 113 are connected to a printed wiring board 111.

In this case, the TCP 1000, excluding a connecting portion of the output-side outer leads 114 within the liquid crystal display panel 109, protrudes from an edge 109a of the liquid crystal display panel 109. When an amount of the protruding portion form the edge 109a of the liquid crystal display panel 109 (hereinafter, referred to as "frame size") is large, the overall liquid crystal module size also becomes large. Therefore, a ratio of an area of a display screen to a module area is decreased. However, the frame size should be minimized, in particular, in the case where the TCP is utilized in equipment having a strict limitation in a module outer shape, for example, in a notebook-sized or subnotebook-sized personal computer or a personal digital assistance (PDA).

In order to reduce the frame size so as to satisfy the needs of market for such personal computers is or personal digital assistances, the following TCPs shown in FIGS. 11 to 14 have been proposed.

Figure 11:
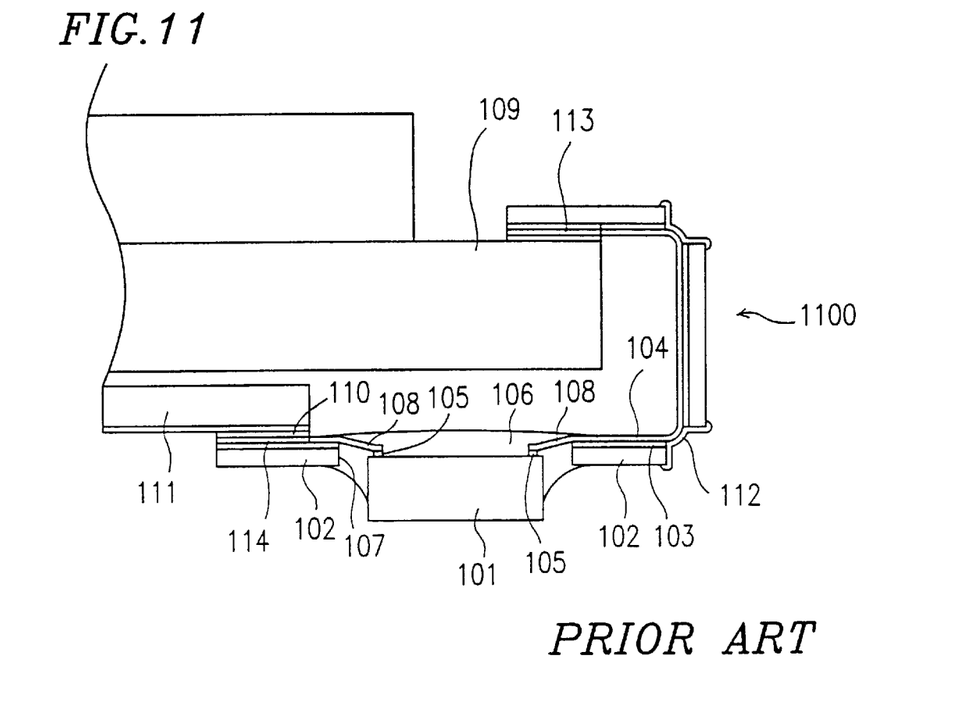
FIG. 11 is a cross-sectional view showing the configuration of a TCP having a bent structure for driving a liquid crystal display panel, attached to the liquid crystal display panel.

FIG. 11 is a cross-sectional view showing the configuration of a TCP 1100 having a bent structure for driving a liquid crystal display panel, attached to the liquid crystal display panel 109. In the TCP 1100 having a bent structure, the portion protruding from the edge 109a of the liquid crystal display panel 109 is bent toward the bottom face of the liquid crystal display panel 109. An insulating resin 112 is applied on the corners formed by the bending. The insulation resin 112 has an anti-bending resistance and protects the conductor pattern 104 which is exposed through slits formed in the insulating film 102 at the corners.

By thus bending the protruding portion toward the bottom side of the liquid crystal display panel 109, an apparent frame size is reduced as shown in FIG. 11. However, an additional portion for bending should be provided for the TCP 1100, the size of the TCP 1100 itself is increased. Accordingly, the fabrication cost thereof is disadvantageously increased. Moreover, since the TCP 1100 is incorporated into a liquid crystal module in a bent state, a thickness of the liquid crystal module is disadvantageously increased.

Figure 12:
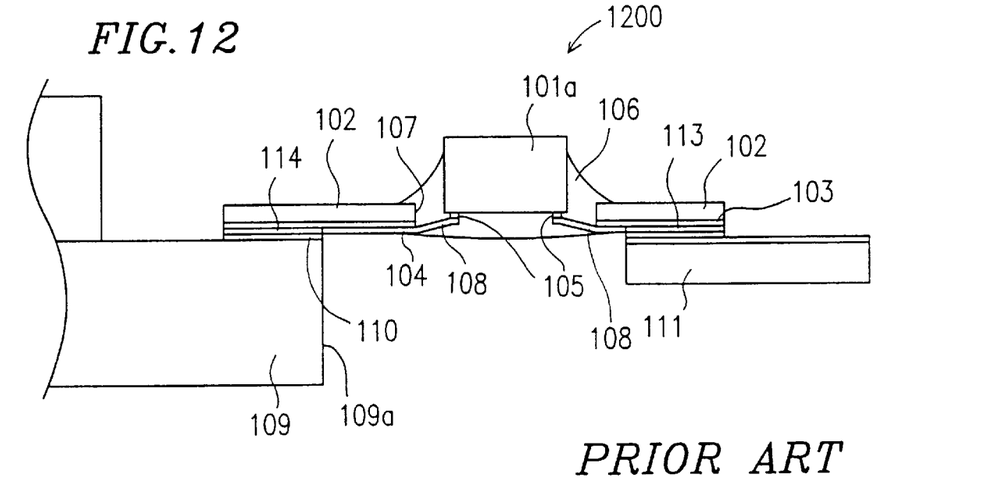
FIG. 12 is a cross-sectional view showing the configuration of a TCP having a conventional structure employing a slim-type semiconductor chip for driving a liquid crystal display panel, attached to a liquid crystal display panel.

FIG. 12 is a cross-sectional view showing a conventional TCP 1200 utilizing a slim-type semiconductor chip 101a for driving a liquid crystal display panel, attached to the liquid crystal display panel. The slim-type semiconductor chip 101a utilized in the TCP 1200 shown in FIG. 12 has a bar-like shape rather then a rectangular shape as conventional.

As shown in FIG. 12, the frame size of the slim type TCP 1200 is increased as compared with the bent type TCP 1100, Nevertheless, since the size of the TCP 1200 itself is reduced, the slim-type TCP is advantageous in view of cost. Moreover, since it is not necessary to bend the protruding region, the fabrication process can be simplified as compared with the bent type TCP 1100 as shown in FIG. 11, On the other hand, as described above, the bent type TCP 1100 is disadvantageous in terms of cost compared with the slim-type TCP 1200. Therefore, the bent type TCP 1200 is not suitable for application to a large liquid crystal display panel employing a large number of TCPs.

In this manner, various type TCPs are mounted onto liquid crystal display panels, taking advantage of features of the respective structures. Among these, in order to satisfy the conflicting needs of the market, that is, the enlargement of a display region of a liquid crystal display panel and the reduction of size of a liquid crystal module, the slim type TCP 1200 having a reduced chip size has been employed so as to reduce the frame size.

However, the reduction of the chip size in a slim type TCP is now reaching the limits due to an increase in the number of output-side outer leads of a semiconductor chip and incorporation of additional new circuits and new features required for a semiconductor chips.

Figure 13:
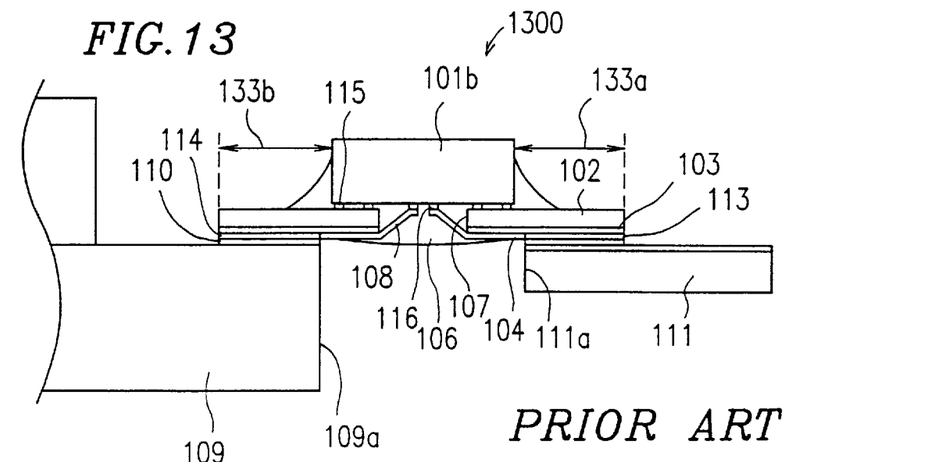
FIG. 13 is a cross-sectional view showing the configuration of a conventional TCP utilizing an inside pad type semiconductor chip for driving a liquid crystal display panel, attached to a liquid crystal display panel.

There has been proposed another configuration of the TCP referred to as "inside pad type" so as to reduce the frame size. FIG. 13 shows a TCP 1300 utilizing an inside pad type semiconductor chip 101b for driving a liquid crystal display panel. In such a configuration, for example, the electrode bumps 116 of the semiconductor chip 101b are positioned so as to be offset toward the central portion from the edge portion of the semiconductor chip 101b.

As shown in FIG. 13, the TCP 1300 includes spacer holding members 115 for holding a predetermined distance between the semiconductor chip 101b and the insulating film 102. In the TCP 1300, a sealing resin 106 is provided so as to coat a joining portion of the inner leads 108 and the semiconductor chip 101b and joining portions of the input-side and output-side outer leads 113 and 114 and the semiconductor chip 101b. The sealing resin 106 covers over the width of the semiconductor chip 101b.

The frame size is the total of a length of the inner-side outer lead 114 between the edge 109a of the liquid crystal display panel 109 and one edge of the semiconductor chip 101b the size (width) of the semiconductor chip 101b including TCP wiring region therein, and a size of the semiconductor chip 101b, a length of the outer-side outer lead 113 between the other edge of the semiconductor chip 101b and an edge 111a of the printed wiring board 111, and additional width of the printed wiring board 111.

The total width of the TCP 1300 can be defined as a width of the semiconductor chip 101b plus an input-side wiring portion 133a and an output-side wiring portion 133b, where the input-sides and output-side wiring portions 133a and 133b are portions of the TCP 1300 extending from the width of the semiconductor chip 101b towards signal input side and signal output side, respectively.

That is, the frame size cannot be reduced to be less than the minimum overall size of the inside pad type TCP 1300 other than the connecting portion of the output-side outer leads 114 overlapping with the peripheral region of the liquid crystal display panel 109.

Figure 14:
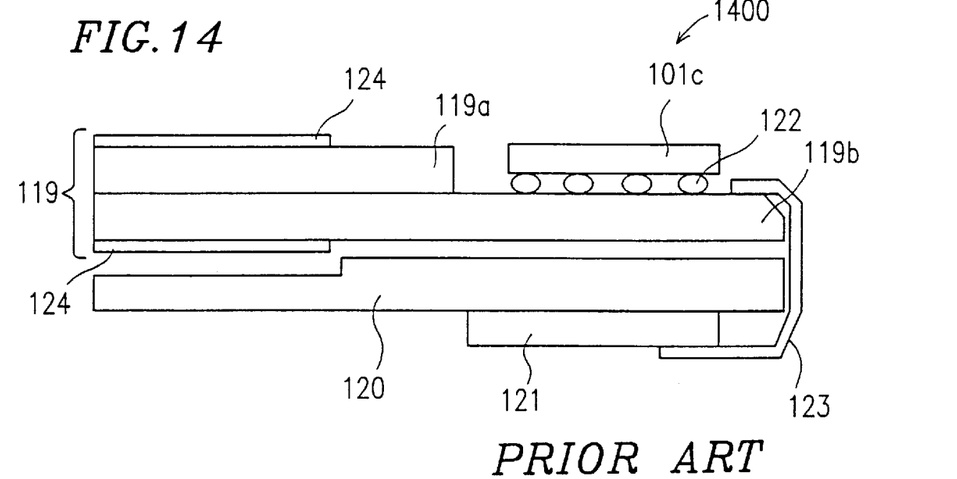
FIG. 14 is a cross-sectional view showing the configuration of a TCP having a conventional COG structure for driving a liquid crystal display panel, attached to a liquid crystal display panel.

Alternatively, instead of utilizing a TCP, a liquid crystal module utilizing bare chip mount having a chip on glass (COG) structure has been employed to reduce the frame size of the liquid crystal module. FIG. 14 is a partial cross-sectional view showing a conventional liquid crystal module 1400 utilizing a COG structure for driving a liquid crystal display panel. As shown in FIG. 14, the liquid crystal module 1400 includes a liquid crystal display panel 119 having an upper glass substrate 119a, a lower glass substrate 119b, and a pair of polarizers 124, a back light 120, a glass epoxy substrate 121, a semiconductor chip 101c having bumps 122 for COG, and a flexible substrate 123. Since the semiconductor chip 101c can be mounted onto wirings (not shown) formed on the lower glass substrate 119b without assembling into a TCP, it is considered that the cost can be reduced.

In the case of the COG shown in FIG. 14, a wafer test is carried out when the wafer is fabricated. However, there are some steps after the wafer test such as dicing the wafer to obtain semiconductor chips and putting the semiconductor chips, which have been determined as nondefective in the wafer test, onto a tray, before the semiconductor chips are mounted on a liquid crystal display module. Thus, there is a possibility that the semiconductor chips which have been judged as nondefective in the wafer test become defective in the subsequent steps due to change in electrical characteristics thereof or adhesion of foreign material or dust thereon through these fabrication steps.

Moreover, the COG method is a bare chip mounting. Therefore, the surface of the semiconductor chip 101c may be contaminated or damaged on the surface in a handling step before the mounting step of the semiconductor chip 101c.

In addition, the COG is disadvantageous in that a burn-in test or the like cannot be performed, compared with TCPs for which a burn-in test is performed in a relatively simple manner. For TCPs, therefor, initial defects occurring therein after mounting can be relatively easily eliminated before delivered into the market. However, there is a possibility that an initial defect occurs in the market.

Furthermore, in the case where a defective semiconductor chip is mounted, the defective semiconductor chip should be removed and replaced with a nondefective chip. However, for COG, great effort must be made to repair the bare semiconductor chip which has already been mounted.

The COG method still has disadvantages as follows: In utilizing the COG method, an arrangement of the electrode bumps 122 on the COG type semiconductor chip 101c is determined in accordance with a substrate, such as the lower glass substrate 119b as shown in FIG. 14 or a glass epoxy substrate, on which the semiconductor chip 101c is mounted. Therefore, in the case where the chip size is changed in accordance with the version-up or the requirement for a reduced chip size, it is necessary to rearrange the electrode bumps 122 on the semiconductor chip 101c. Once the bump electrode arrangement of the semiconductor chip 101c is changed, the design of the bonded portion of the substrate on which the semiconductor chip 101c is mounted should be also changed in accordance with a new bump arrangement of the semiconductor chip 101c. The design of the substrate should be changed each time when a size of the semiconductor chip 101c is changed, resulting in an increase of cost.

On the other hand, a change in the substrate on which the semiconductor chip 101c is mounted and the resulting change in a bonding portion thereof for the semiconductor chip 101c require a change in the arrangement of electrode bumps 122 of the semiconductor chip 101c.

Accordingly, in the case where the semiconductor chip 101a or the substrate on which the semiconductor chip 101c is to be mounted is changed, the COG method does not have much flexibility and tolerance for the change.

SUMMARY OF THE INVENTION

The tape carrier package of this invention includes a semiconductor chip including a first row of electrode bumps formed on a surface of the semiconductor chip; and a second row of electrode bumps formed on the surface of the semiconductor chip parallel to the first row; an insulating film, at least a portion of the insulating film being formed on the semiconductor chip; a conductor pattern including a first lend section formed on the insulating film and connectable to an external device and a second lead section extending from the first lead section so as to electrically connect to the first and second rows of electrode bumps, at least a part of the first lead section being positioned on the semiconductor chip, and a sealing resin for sealing at least a junction between the first and second rows of electrode bumps and the second lead section.

In one embodiment of the present invention, the first and second rows of electrode bumps are formed in a vicinity of a first edge of the semiconductor chip.

In one embodiment of the present invention, the first row of electrode bumps is formed in a vicinity of a first edge of the semiconductor chip, and the second row of electrode bumps is formed in a vicinity of a second edge of the semiconductor chip opposed to the first edge.

In one embodiment of the present invention, the portion of the insulating film formed on the semiconductor chip is positioned between the first row and the second row of electrode bumps.

In one embodiment of the present invention, the first and second rows of electrode bumps are formed along a center of the semiconductor chip.

In one embodiment of the present invention, the first row of electrode bumps is formed in a vicinity of a first edge of the semiconductor chip, and the second row of electrode bumps is formed along a center of the semiconductor chip.

In one embodiment of the present invention, a spacer holding member is provided between the semiconductor chip and the insulating film so as to form a gap therebetween, the gap between the semiconductor chip and the insulating film being filled with the sealing resin.

The tape carrier package of this invention includes a semiconductor chip including a first row of electrode bumps formed on a surface of the semiconductor chip; and a second row of electrode bumps formed on the surface of the semiconductor chip parallel to the first row; an insulating film formed on the semiconductor chip; a conductor pattern including a first lead section formed on the insulating film and connectable to an external device and a second lead section extending from the first lead section so as to electrically connect to the first and second rows of electrode bumps, the entire conductor pattern being positioned within the semiconductor chip; and a sealing resin for sealing at least a junction between the first and second rows of electrode bumps and the second lead section.

In one embodiment of this invention, the first and second rows of electrode bumps are formed in a vicinity of a first edge of the semiconductor chip.

In one embodiment of this invention, the first row of electrode bumps is formed in a vicinity of a first edge of the semiconductor chip, and the second row of electrode bumps is formed in a vicinity of a second edge of the semiconductor chip opposed to the first edge.

In one embodiment of this invention, the insulating film is positioned between the first row and the second row of electrode bumps.

In one embodiment of this invention, the first and second rows of electrode bumps are formed along a center of the semiconductor chip.

In one embodiment of this invention, the first row of electrode bumps is formed in a vicinity of a first edge of the semiconductor chip, and the second row of electrode bumps is formed along a center of the semiconductor chip.

In one embodiment of this invention, a spacer holding member is provided between the semiconductor chip and the insulating film so as to form a gap therebetween, the gap between the semiconductor chip and the insulating film being filled with the sealing resin.

The liquid crystal display device of this invention includes: a tape carrier package comprising a semiconductor chip including a first row of electrode bumps formed on a surface of the semiconductor chip; and a second row of electrode bumps formed on the surface of the semiconductor chip parallel to the first row; an insulating film, at least a portion of the insulating film being formed on the semiconductor chip; a conductor pattern including a first lead section formed on the insulating film and connectable to an external device and a second lead section extending from the first lead section so as to electrically connect to the first and second rows of electrode bumps, at least a part of the first lead section being positioned on the semiconductor chip; and a sealing resin for sealing at least a junction between the first and second rows of electrode bumps and the second lead section, a liquid crystal display panel including a glass substrate and a printed wiring board connected to the first lead section of the tape carrier package, wherein the tape carrier package is mounted onto the liquid crystal display panel so that the semiconductor chip overlaps one of the glass substrate and the printed wiring board.

Thus, the Invention described herein makes possible the advantages of (1) providing a tape carrier package realizing a reduced frame size with an improved mechanical strength and (2) providing a liquid crystal display device including such a tape carrier package.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples.

EXAMPLE 1

Figure 1:
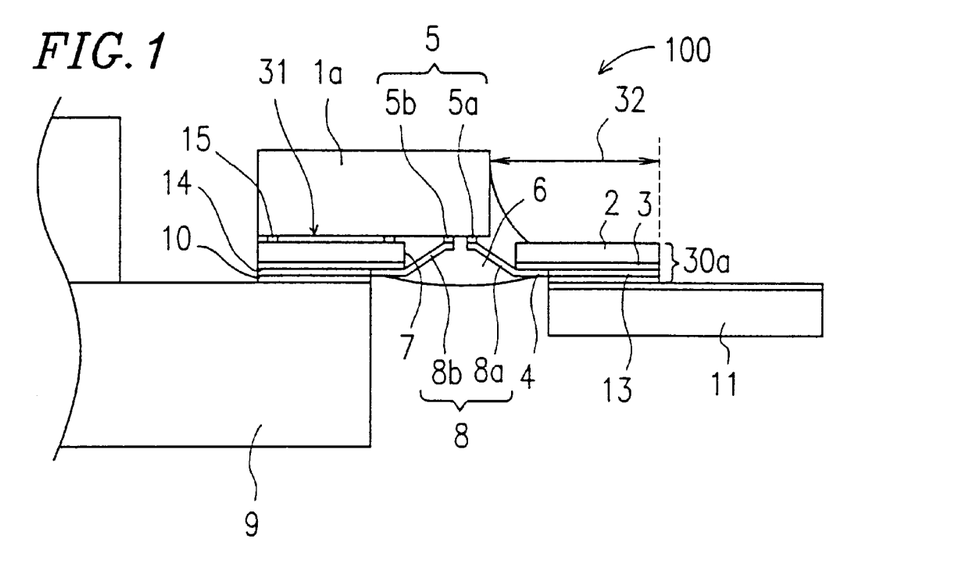
FIG. 1 is a cross-sectional view showing the structure of a TCP utilizing an inside pad type semiconductor chip for driving a liquid crystal display panel, and the configuration of the TCP attached to the liquid crystal display panel in Example 1 according to the present invention.

FIG. 1 is a cross-sectional view showing the structure of a TCP 100 in Example 1 according to the present invention, for driving a liquid crystal display panel 9. The TCP 100 utilizes an inside pad type semiconductor chip 1a and is connected to the liquid crystal display panel 9 of a liquid crystal display (partially shown in FIG. 1).

As shown in FIG. 1, the TCP 100 includes the semiconductor chip 1a having electrode bumps 5 and a tape carrier portion having a device hole 7 in which the semiconductor chip 1a is placed.

As shown in FIG. 1, the semiconductor chip 1a is an inside pad type chip. The electrode bumps 5 of the semiconductor chip 1a are arranged in two rows including an input signal electrode bump row 5a and an output signal electrode bump row 5b. The input signal electrode bump row 5a and output signal electrode bump row 5b are arranged so as to be parallel to at least two opposed edges of the semiconductor chip 1a and to be positioned about 200 µm inside from the edge of the semiconductor chip 1a, respectively. A distance between the two bump rows 5a and 5b is about 190 µm, that is, the two rows are arranged in close vicinity to each other.

A carrier tape of the tape carrier portion, which includes a tape carrier portion 30a (input signal side) has a three-layered structure including an insulating film 2, an adhesive layer 3, and a conductor pattern 4. The conductor pattern 4 is patterned so as to form inner leads 8 including input-side inner leads 8a and output-side inner leads 8b, output-side outer leads 14 serving as connection terminals for a liquid crystal device driving signal, and input-side outer leads 13 serving as source terminals for driving the semiconductor chip and as connection terminals for an image signal. There are provided space holding members 15 between the semiconductor chip 1a and the insulating film 2 so as to hold a predetermined distance between the semiconductor chip 1a and the insulating film 2.

The input-side and output-side inner leads 8b and 8b are bonded to the corresponding bump of the input and output signal electrode bumps rows 5a and 5b of the semiconductor chip 1a, respectively. A sealing resin 6 is provided so as to coat the junction portion of the semiconductor chip 1a and the inner leads 8.

In this example, as shown in FIG. 1, the output signal electrode bump row 5b is arranged on the semiconductor chip 1a so as to be offset toward the chip edge where the input signal electrode bump row 5a is provided. Therefore, the output-side outer leads 14 are shifted towards inside the semiconductor chip 1a so that the output-side outer leads 14 are, at least partially, and preferably entirely, positioned within the width of the semiconductor chip 1a. In the preferable case, the entire output-side outer loads 14 face a bump-mounted surface 31 of the semiconductor chip 1a and the output-side outer leads 14 do not extend outside of the semiconductor chip 1a (i.e., within a device forming region of the semiconductor chip 1a).

According to this example, at least part of the output-side outer leads 14 are arranged so as to face the bump-mounted surface 31 of the semiconductor chip 1a in an overlapped manner, whereby the semiconductor chip 1a overlaps with the liquid crystal display panel 9. The size of the TCP 100 is substantially reduced to a total of the size of the semiconductor chip 1a and an input-side wiring portion 32, where the input-side wiring portion 32 is defined as a portion of the TCP 100 extending from the width of the semiconductor chip 1a towards a signal input side, including a part of the junction portion coated with the sealing resin 6 between the semiconductor chip 1a and the carrier tape portion 30a having the input-side outer leads 13, and the carrier tape portion 30a.

In the conventional structure, as described above using FIG. 13, the total size of the TCP 1300 is the width of the semiconductor chip 101b plus the input-side wiring portion 133a and the output-side wiring portion 133b. The frame size of the TCP 1300 is equal to the total size of the width of the semiconductor chip 101b plus the input-side wiring portion 133a and the additional width of the printed wiring board 111, and the output-side wiring portion 133b, minus the connecting portion overlapping with the liquid crystal display panel 109.

With the configuration of the TCP 100 of this example of the present invention, as described above, it is possible to overlap the semiconductor chip 1a, at least a part of the output-side outer leads 14, and the liquid crystal display panel 9. Therefore, the frame size can be reduced even in the case where a semiconductor chip 1a having a conventional size is used for the TCP 100.

Next, the fabrication of the TCP 100 of this example is described. First, a semiconductor chip 1a having electrode bumps 5 is fabricated by plating electrodes (pads) which are formed on a wafer with a metal such as gold so as to form the electrode bumps 5, attaching the resultant wafer with the bumps 5 onto a dicing sheet, and then dicing the wafer by a dicing apparatus into the semiconductor chip 1a having a predetermined size. Although the size and the height of each of the bumps 5 vary depending on a bump pitch, the bump size and the bump height are preferably within the range of about 40 to 100 $\mu$m and within the range of about 10 to 20 $\mu$m, respectively. In the present example, a bump pitch is set at about 70 $\mu$m for the output signal electrode bump row 5b on the output side, and set at between about 200 $\mu$m and 300 $\mu$m for the input signal electrode bump row 5a on the input side.

In addition, the input signal electrode bump row 5a and output signal electrode bump row 5b are arranged so as to be parallel to at least two opposed edges of the semiconductor chip 1a, and to be positioned about 200 $\mu$m inside from the edges of the semiconductor chip 1a, respectively. A distance between the two bump rows 5a and 5b is about 190 $\mu$m, that is, the two rows are arranged in close vicinity to each other.

As shown in FIG. 1, the output signal electrode bump row 5b is arranged on the semiconductor chip 1a so as to be offset toward the chip edge where the input signal electrode bump row 5a is provided. Therefore, all the output-side outer leads 14 are positioned within the region of the semiconductor chip 1a where a device is formed.

Then, the semiconductor chip 1a is placed into a device hole 7 of a tape carrier. The tape carrier includes an insulating film 2 made of polyimide or the like as a tape substrate, and a conductor pattern 4 deposited thereon through an adhesive layer 3.

As the insulating film 2, a film made of polyimide type materials such as "UPILEX" (manufactured by Ube Industries, Ltd.), "KAPTON" (manufactured by Toray-Du Pont Co., Ltd. and Du Pont Co., Ltd.), and "APICAL" (manufactured by Kaneka Corporation) is utilized. A thickness of the insulating film 2 is set at about 75 $\mu$m or less. The adhesive layer 3 is made of an epoxy type material having a thickness of about 13 $\mu$m.

The conductor pattern 4 is patterned so as to form inner leads 8, output-side outer leads 14, and input-side outer leads 13. The conductor pattern 4 is formed by etching an electrolytic copper foil having a thickness of about 18 $\mu$m. The surface of the conductor pattern 4 is plated with tin, gold, nickel or a solder to a thickness in the range of about 0.2 to 0.4 $\mu$m. Moreover, in order to preserve the insulation property, a solder resist (not shown) is applied onto the wiring pattern region except for the inner leads 8, the input-side outer leads 13, and the output-side outer leads 14 by printing. The surfaces of the inner leads 8, the input-side outer leads 13, and the output-side outer leads 14 are plated with a tin layer having a thickness in the range of 0.1 to 0.3 $\mu$m.

The number of the output-side outer leads 14 is about 240, and the sum of the output-side outer leads 14 and input-side outer leads 13 is about 300. A width of the input-side outer lead 13 and the output-side outer lead 14 is about 0.5 mm, and a width of the device hole 7 is about 0.5 mm.

In the inner lead bonding step, the bumps of the bump rows 5a and 5b on the semiconductor chip 1a and inner leads 8a and 8b of the tape carrier are respectively bonded by using an inner lead bonder. In this example, gold bumps are used as the bumps 5. When the gold of the gold bumps 5 and tin of the inner leads 8 form autectic alloy, the bonding is completed.

A plurality of the spacer holding members 15 for keeping a predetermined distance between the semiconductor chip 1a and the insulating film 2 are arranged in the vicinity of the device hole 7 and in the outer periphery of the semiconductor chip 1a. As a result, a gap necessary for filling by the sealing resin 6 is kept between the surface of the semiconductor chip 1a and the insulating film 2.

Then, the gap is filled with a sufficient amount of the sealing resin 6 so as to protect the surface of the semiconductor chip 1a and to ensure a sufficient mechanical strength. The spacer holding members 15 are as high as the bumps for connection with the inner leads 8, i.e., have a height between about 10 $\mu$m and about 20 $\mu$m. Therefore, by providing the spacer holding members 15, the insulating film 2 and the semiconductor chip 1a can be separated from each other by about 10 $\mu$m to about 30 $\mu$m.

In view of the flowability, a sealing resin 6 having a viscosity in the range of about 200 to 400 poise is utilized. If the sealing resin 6 has a poor flowability, a space which is not filled with the sealing resin 6 may be generated between the insulating film 2 and the semiconductor chip 1a. The occurrence of such an unfilled space can be prevented to some extent by appropriately adjusting the curing conditions of the sealing resin 6.

After the gap between the insulating film 2 and the semiconductor chip 1a is filled with the sealing resin 6, the amount of the sealing resin 6 is adjusted so as not to overflow from the semiconductor chip 1a. The sealing resin 6 is prevented from being protuberant from the insulating film 2 by about 50 $\mu$m or more in the device hole 7. This is because, if the sealing resin 6 is too protuberant from the insulating film 2, it is difficult to bond the semiconductor chip 1a and the inner leads 8 together upon mounting.

The TCP 100 is mounted onto the liquid crystal display panel 9 through the anisotropic conductor film (ACF) 10. In order to mount the TCP 100, heating is performed on the side of the semiconductor chip 1a so that the junctions of the input-side outer leads 13 and the output-side outer leads 14 with the ACF 10 are heated to about 200° C. In order to withstand such a temperature, the sealing resin 6 employed has a high Tg, i.e., about 140° C. Since heat and pressure are applied on the bottom face of the semiconductor chip 1a upon mounting the ACF, a polyimide coating (not shown) having a thickness of about 10 $\mu$m is formed on the surface of the semiconductor chip 1a so as to prevent the surface of the semiconductor chip 1a from being damaged.

EXAMPLE 2

Figure 2:
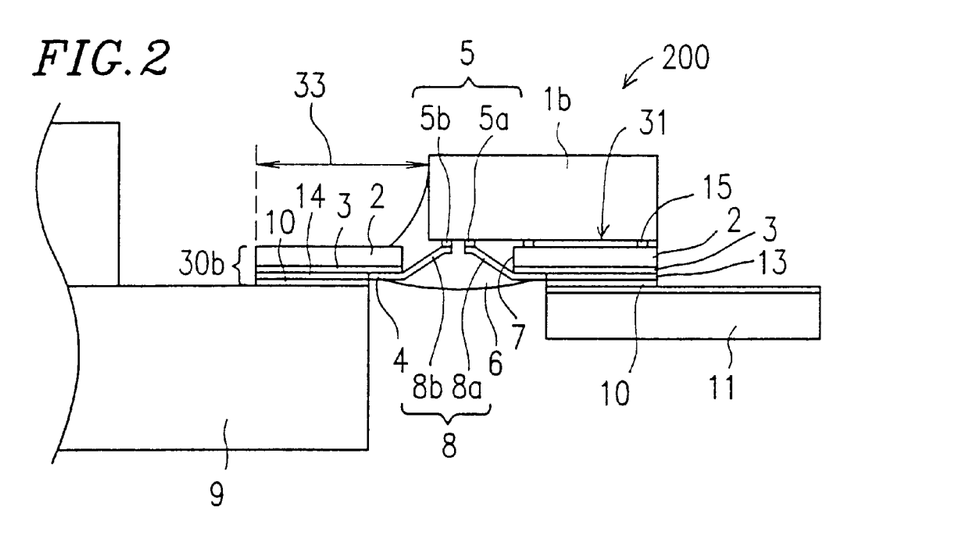
FIG. 2 is a cross-sectional view showing the structure of a TCP utilizing an inside pad type semiconductor chip for driving a liquid crystal display panel, and the configuration of the TCP attached to the liquid crystal display panel in Example 2 according to the present invention.

FIG. 2 is a cross-sectional view showing the structure of a TCP 200 utilizing an inside pad type semiconductor chip, for driving a liquid crystal display panel, and the configuration of the TCP 200 attached to the liquid crystal display panel In Example 2 according to the present invention.

The structure of the TCP 200 is basically the same as that of the TCP 100 described with reference to FIG. 1. However, the TCP 200 differs from the TCP 100 in that the input signal electrode bump row 5a is offset toward the outer peripheral region of the semiconductor chip 1b where the output signal electrode bump row 5b is formed.

Therefore, the input-side outer leads 13 are shifted towards inside the semiconductor chip 1b so that the input-side outer leads 13 are, at least partially, and preferably entirely, positioned within the width of the semiconductor chip 1b. In the preferable case, the entire input-side outer leads 13 face a bump-mounted surface 31 of the semiconductor chip 1b and the input-side outer leads 13 do not extend outside the semiconductor chip 1b (i.e., within a device forming region of the semiconductor chip 1b).

According to this example, at least a part of the input-side outer leads 13 are arranged so as to face the bump-mounted surface 31 of the semiconductor chip 1b in an overlapped manner, whereby the semiconductor chip 1b overlaps with the printed wiring board 11. The size of the TCP 200 is substantially reduced to a total of the size of the semiconductor chip 1b and an output-side wiring portion 33, where the output-side wiring portion 33 is defined as a portion of the TCP 200 extending from the width of the semiconductor chip 1b towards a signal output side, including a part of the junction portion coated with the sealing resin 6 between the semiconductor chip 1b and the carrier tape portion 30b (output signal side), having the output-side outer leads 14, and the carrier tape portion 30b.

With the configuration of the TCP 200 of this example of the present invention, as described above, it is possible to overlap the semiconductor chip 1b, at least a part of the input-side outer leads 13, and the printed wiring board 11. Therefore, the frame size can be reduced even in the case where a semiconductor chip 1b having a conventional size are used for the TCP 200.

The fabrication of the TCP 200 of this example is the same as that of the TCP 100 of the first example described above, except for the arrangement of the electrode bumps 5 of the semiconductor chip 1b.

EXAMPLE 3

Figure 3:
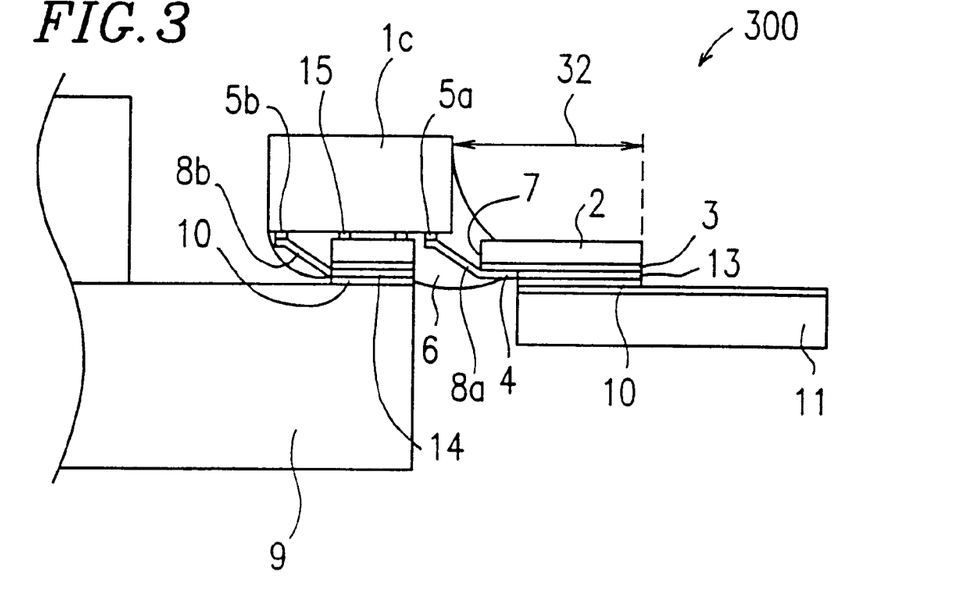
FIG. 3 is a cross-sectional view showing the structure of a TCP utilizing a slim-type semiconductor chip for driving a liquid crystal display panel, and the configuration of the TCP attached to the liquid crystal display panel in Example 3 according to the present invention.

FIG. 3 is a cross-sectional view showing the structure of a TCP 300 utilizing a slim-type semiconductor chip 1c, for driving a liquid crystal display panel, and the configuration of the TCP 300 attached to the liquid crystal display panel 9 in Example 3 according to the present invention.

In the TCP 300, the input signal electrode bump row 5a and the output signal electrode bump row 5b are arranged in the respective outer peripheral regions of the semiconductor chip 1c. As shown in FIG. 3, the output-side outer leads 14 are positioned within the region between the input signal electrode bump row 5a and the output signal electrode bump row 5b, where the device is formed. Therefore, the size of the TCP 300 is substantially reduced to a total of the size of the semiconductor chip 1c and an input-side wiring portion 32.

Accordingly, the semiconductor chip 1c overlaps with the liquid crystal display panel 9. More specifically, a substantial portion of the semiconductor chip 1c is placed on the liquid crystal display panel 9, as shown in FIG. 3. Therefore, with the configuration of the TCP 300 of this example, the frame size can be further reduced in the case that a slim-type semiconductor chip 1c in utilized. As a result, the liquid crystal module size is reduced.

The fabrication of the TCP 300 of this example is similar to that of the TCP 100 of the first example described above, except for the type of the semiconductor chip 1c and the arrangement of the electrode bumps 5 of the semiconductor chip 1c.

EXAMPLE 4

Figure 4:
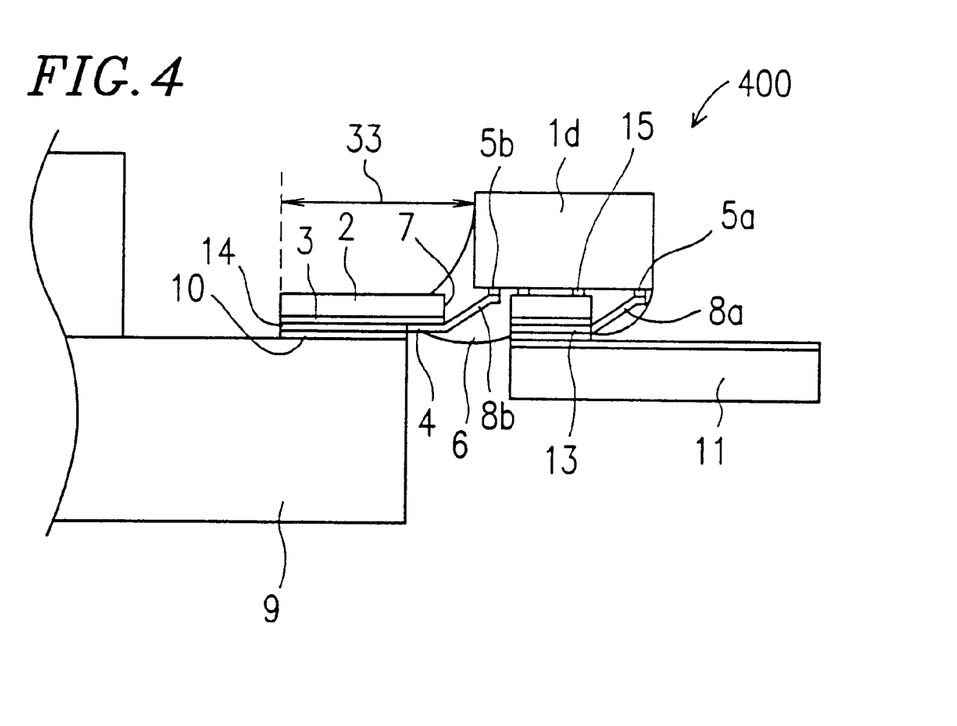
FIG. 4 is a cross-sectional view showing the structure of o TCP utilizing a slim-type semiconductor chip for driving a liquid crystal display panel, and the configuration of the TCP attached to the liquid crystal display panel in Example 4 according to the present invention.

FIG. 4 is a cross-sectional view showing the structure of a TCP 400 utilizing a slim-type semiconductor chip 1d, for driving a liquid crystal display panel, and the configuration of the TCP 400 attached to the liquid crystal display panel 9 in Example 4 according to the present invention.

The structure of the slim type TCP 400 in basically the same as that of the slim type TCP 300 described with reference to FIG. 3. However, the TCP 400 differs from the TCP 300 in that, instead of the output-side outer leads 14, the input-side outer leads 13 are positioned within the region between the input signal electrode bump row 5a and the output signal electrode bump row 5b, where the device is formed.

Accordingly, the semiconductor chip 1d overlaps with the printed wiring board 11. More specifically, a substantial portion of the semiconductor chip 1d is placed on the printed wiring board 11, as shown in FIG. 4. Therefore, with the configuration of the TCP 400 of this example, the frame size can be further reduced in the case that a slim-type semiconductor chip 1d is utilized. As a result, the liquid crystal module size is reduced.

The fabrication of the TCP 400 of this example is similar to that of the TCP 100 of the first example described above, except for the type of the semiconductor chip 1d and the arrangement of the electrode bumps 5 of the semiconductor chip 1d.

EXAMPLE 5

Figure 5A:
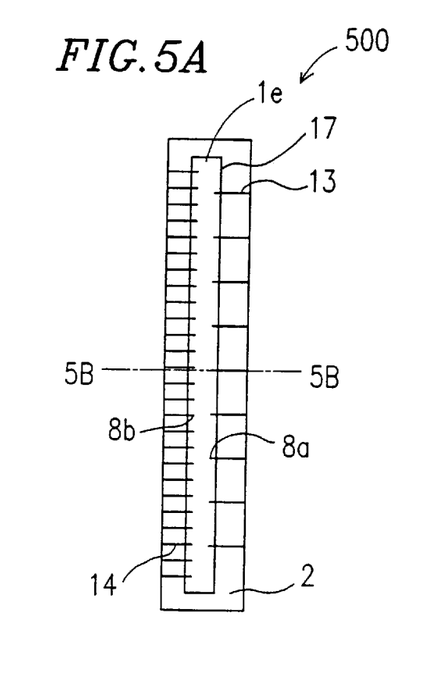
FIG. 5A is a plan view showing a TCP utilizing an inside pad type semiconductor chip in Example 5 according to the present invention.
Figure 5B:
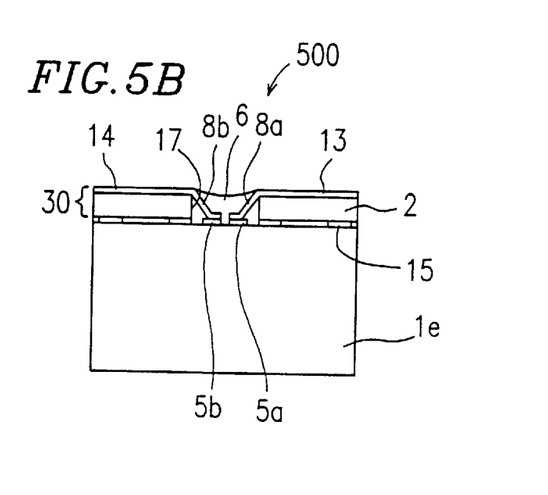
FIG. 5B is a cross-sectional view of the TCP taken along a line 5B—5B in FIG. 5A.
Figure 5C:
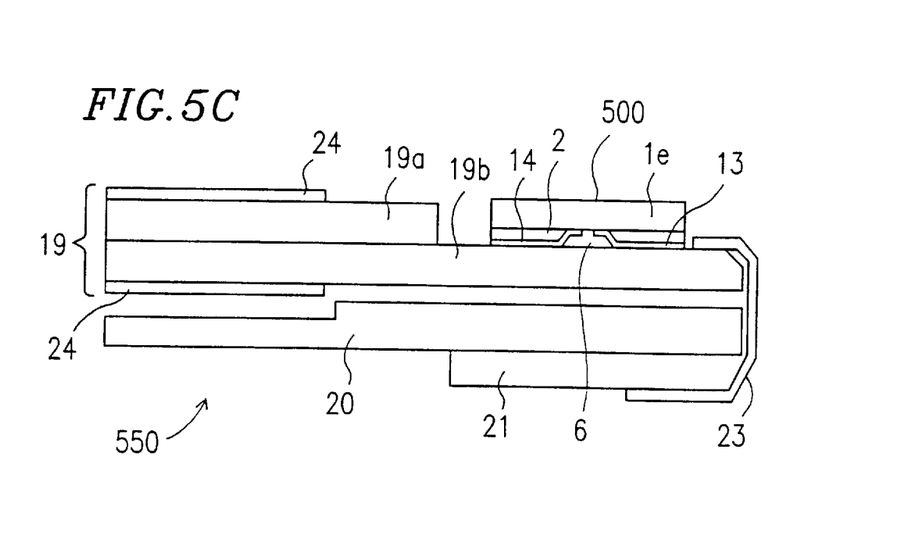
FIG. 5C is a cross-sectional view showing the configuration of the TCP shown in FIG. 5A attached to the liquid crystal display panel.

FIG. 5A is a plan view showing a TCP 500 utilizing an inside pad type semiconductor chip 1e in Example 5 according to the prevent invention. FIG. 5B is a cross-sectional view of the TCP 500 taken along a line 5B—5B in FIG. 5A. FIG. 5C is a partial cross-sectional view showing a liquid crystal display module 550 utilizing the TCP 500 shown in FIG. 5A.

The liquid crystal display module 550 includes a liquid crystal display panel 19 having an upper glass substrate 19a, a lower glass substrate 19b, and a pair of polarizers 24, a back light 20, a glass epoxy substrate 21, a TCP 500 including a semiconductor chip 1a attached to the lower glass substrate 19b, and a flexible substrate 123.

As shown in FIG. 5B, the semiconductor chip 1e is an inside pad type chip. The electrode bumps 5 of the semiconductor chip 1e are arranged in two rows of input signal electrode bump row 5a and output signal electrode bump row 5b. The input signal electrode bump row 5a and output signal electrode bump row 5b are arranged in a center portion of the semiconductor chip 1e so as to be parallel to at least two opposed edges of the semiconductor chip 1e.

A tape carrier portion 30 of the TCP 500 including an insulation film 2 has a device hole 17. A device portion of the semiconductor chip 1e (i.e., a surface portion where the bumps 5 are formed) is placed in the device hole 17. A plurality of the spacer holding members 15 are provided between the semiconductor chip 1e and the insulating film 2 so as to keep a predetermined distance between the semiconductor chip 1e and the insulating film 2. As a result, a gap necessary for filling by the sealing resin 6 is kept between the surface of the semiconductor chip 1e and the insulating film 2.

As shown in FIGS. 5A and 5B, input-side outer leads 13 are formed on the insulating film 2, and input-side inner leads 8a extend from the input-side outer leads 13 on the input signal side. Similarly, output-side outer leads 14 are formed on the insulating film 2, and output-side inner leads 8b extend from the output-side outer leads 14 on the output signal side.

The input-side and output-side inner leads 8a and 8b are bonded to the corresponding bumps of the input and output signal electrode bumps rows 5a and 5b of the semiconductor chip 1e, respectively. A sealing resin 6 is provided in the device hole 17 so as to coat the junction portion of the semiconductor chip 1e and the inner leads 8, In this example, as shown in FIGS. 5A and 5B, the input-side outer leads 13 and the output-side outer leads 14 are both shifted towards inside the semiconductor chip 1e so as to be positioned within the width of the semiconductor chip 1e. That is, the entire width of the TCP 500 is substantially equal to the width of the semiconductor chip 1e.

Therefore, as shown in FIG. 5C, according to the TCP 500 of this example, the frame size can be reduced to en extent that the above described COG method is utilized. In addition, the TCP 500 of this example has much flexibility and tolerance for a change in bump arrangement of the semiconductor chip 1e and a change in a substrate to which the TCP 500 is to be mounted, utilizing a carrier tape including the input-side outer leads 13, the output-side outer leads 14 and inner leads 8 which are more easily rearranged compared with the above described COG method.

EXAMPLE 6

Figure 6A:
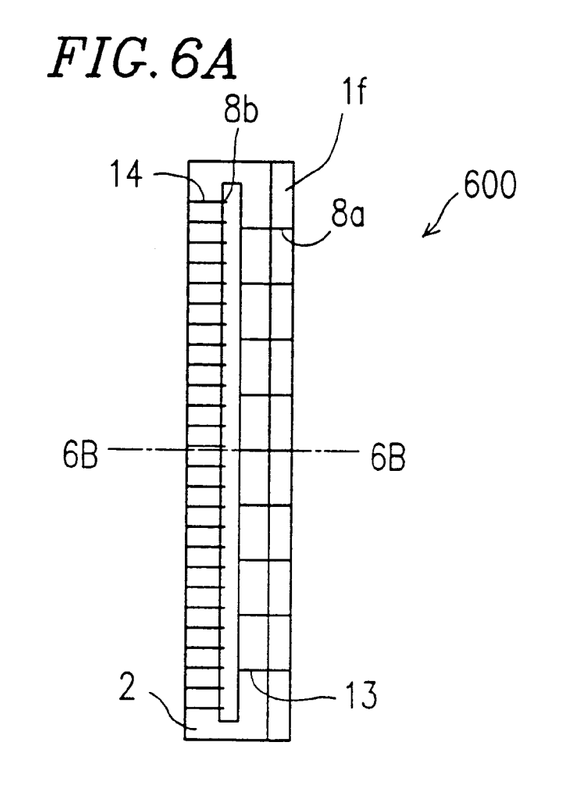
FIG. 6A is a plan view showing a TCP in Example 6 according to the present invention.
Figure 6B:
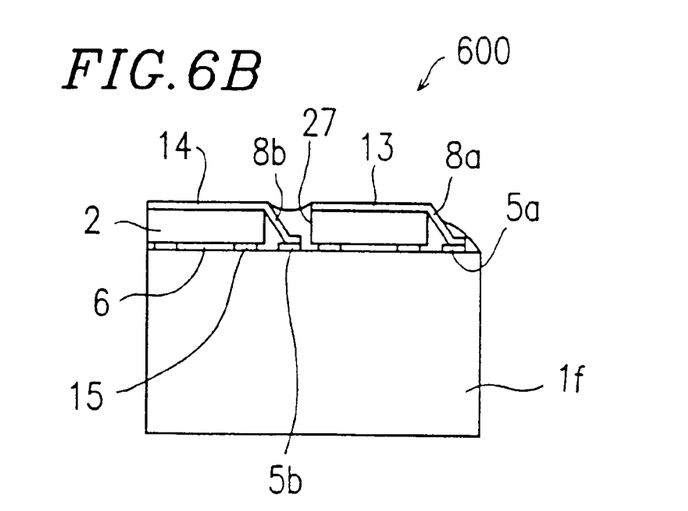
FIG. 6B is a cross-sectional view of the TCP taken along a line 6B—6B in FIG. 6A.

FIG. 6A is a plan view showing a TCP 600 of Example 6 according to the present invention. FIG. 6B is a cross-sectional view of the TCP 500 taken along a line 6B—6B in FIG. 6A.

As shown in FIG. 6B, the TCP 600 includes a semiconductor chip 1f in which the input signal electrode bump row 5a is provided in the outer peripheral region of the semiconductor chip 1f. The output signal electrode bump row 5b is provided in the vicinity of the central portion of the semiconductor chip 1f so as to be parallel to the input signal electrode bump row 5a.

In the TCP 600, an insulating film 2 having a device hole 27 is provided on the semiconductor chip 1f. As shown in FIGS. 6A and 6B, the insulating film 2 is shifted from an input-side edge of the semiconductor chip 1f where the input signal electrode bumps 5a are formed. The output signal electrode bump row 5b is placed in the device hole 27.

A plurality of the spacer holding members 15 are provided between the semiconductor chip 1f and the insulating film 2 so as to keep a predetermined distance between the semiconductor chip 1f and the insulating film 2. As a result, a gap necessary for filling the sealing resin 6 is kept between the surface of the semiconductor chip 1f and the insulating film 2.

As shown in FIGS. 6A and 6B, input-side outer leads 13 are formed on the insulating film 2 on the input signal side, and input-side inner leads 8a extend from the input-side outer leads 13 so as to be bonded to the corresponding input signal electrode bumps 5a. Similarly, output-side outer leads 14 are foamed on the insulating film 2 on the output signal side, and output-side inner leads 8b extend from the output-side outer leads 14 so as to be bonded to the corresponding output signal electrode bumps 5b.

A sealing resin 6 is provided in the device hole 27 so as to coat the junction portion of the semiconductor chip 1f and the output-side inner leads 8b. The sealing resin 6 is also provided in the vicinity of the input-side edge of the semiconductor chip 1f so as to coat the junction portion of the semiconductor chip 1f and the input-side inner leads 8a.

In this example, as shown in FIGS. 6A and 6B, the input-side outer leads 13 and the output-side outer leads 14 are both provided within the width of the semiconductor chip 1f. That is, the entire width of the TCP 600 is substantially equal to the width of the semiconductor chip 1f.

Therefore, according to the TCP 500 of this example, the frame size can be reduced to an extent that the above described COG method is utilized. In addition, the TCP 600 of this example has much flexibility and tolerance for a change in bump arrangement of the semiconductor chip 1f and a change in a substrate to which the TCP 600 is to be mounted, utilizing a carrier tape including the input-side outer leads 13, the output-side outer leads 14 and inner leads 8 which are more easily rearranged compared with the above described COG method.

EXAMPLE 7

Figure 7A:
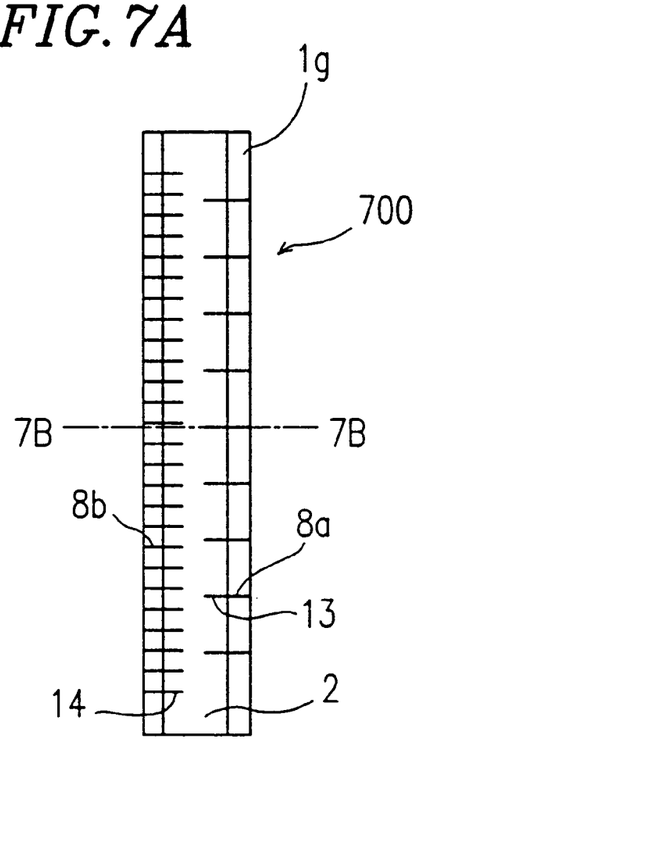
FIG. 7A is a plan view showing a TCP in Example 7 according to the present invention.
Figure 7B:
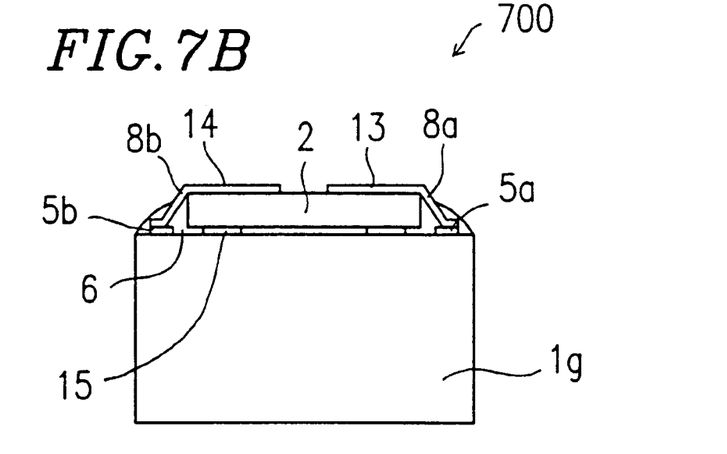
FIG. 7B is a cross-sectional view of the TCP taken along a line 7B—7B in FIG. 7A.

FIG. 7A is a plan view showing a TCP 700 in Example 7 according to the present invention. FIG. 7B is a cross-sectional view of the TCP 700 taken along a line 7B—7B in FIG. 7A.

As shown in FIG. 7B, the TCP 700 includes a semiconductor chip 1g in which input signal electrode bump row 5a and output signal electrode bump row 5b are provided in the respective outer peripheral regions of the semiconductor chip 1g. The output signal electrode bump row 5b is provided so as to be parallel to the input signal electrode bump row 5a.

In the TCP 700, an Insulating film 2 is provided between the input signal electrode bump row 5a and the output signal electrode bump row 5b on the semiconductor chip 1g. A plurality of the spacer holding members 15 are provided between the semiconductor chip 1g and the insulating film 2 so as to keep a predetermined distance between the semiconductor chip 1g and the insulating film 2. As a result, a gap necessary for filling the by sealing resin 6 is kept between the surface of the semiconductor chip 1g and the insulating film 2.

As shown in FIGS. 7A and 7B, input-side outer leads 13 are formed on the insulating film 2 on the input signal side, and input-side inner leads 8a extend from the input-side outer leads 13 so as to be bonded to the corresponding input signal electrode bumps 5a. Similarly, output-side outer leads 14 are formed on the insulating film 2 on the output signal side, and output-side inner leads 8b extend from the output-side outer leads 14 so as to be bonded to the corresponding output signal electrode bumps 5b.

A sealing resin 6 is provided in the vicinity of the input-side edge end output-side edge of the semiconductor chip 1g so as to coat the junction portions of the semiconductor chip 1g and the input-side inner leads 8a and the output-side inner leads 8b, respectively.

In Examples 1 to 6 described above, sealing resin 6 having a viscosity in the range of about 200 to 400 poise is utilized to fill the gap between the insulating film 2 and the semiconductor chip 1. In Example 7, however, a sealing resin 6 having a viscosity in the range of about 50 to 150 poise is utilized so as to more easily fill the gap, In this example, as shown in FIGS. 7A and 7B, the input-side outer leads 13 and the output-side outer leads 14 are both provided within the width of the semiconductor chip 1g. That is, the entire width of the TCP 700 is substantially equal to the width of the semiconductor chip 1g.

Therefore, according to the TCP 700 of this example, the frame size can be reduced to an extent that the above described COG method is utilized. In addition, the TCP 700 of this example has much flexibility and tolerance for a change in bump arrangement of the semiconductor chip 1g and a change in a substrate to which the TCP 700 is to be mounted, utilizing a carrier tape including the input-side outer leads 13, the output-side outer leads 14 and inner leads 8 which are more easily rearranged compared with the above described COG method.

In addition, according to this example, a semiconductor chip having bumps formed on the edge thereof, which is frequently employed in a conventional TCP, can be utilized.

EXAMPLE 8

Figure 8:
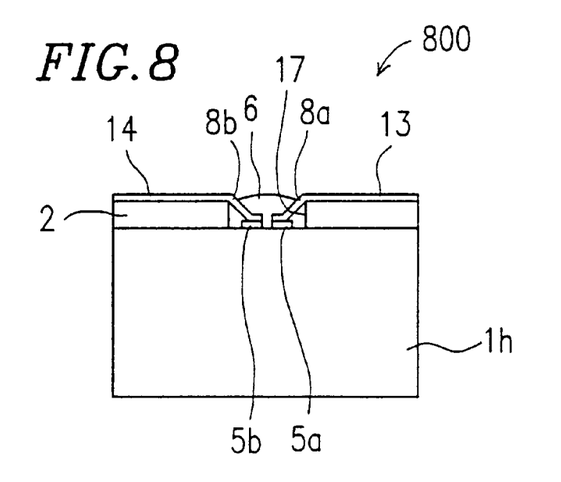
FIG. 8 is a cross-sectional view showing a modification of a TCP according to the present invention in the case where spacer holding members are not utilized.

FIG. 8 shows a TCP 800 in which the spacer holding members 15 are not used. That is, instead of using the spacer holding member 15, the insulating film 2 and the semiconductor chip 1h may be bonded to each other with an adhesive or the like, or may be directly bonded to each other without using any adhesive, as shown in FIG. 8.

In this case, thermo-compressive wiring for mounting the ACF onto the liquid crystal display panel 9 can be more easily performed as compared with the case where the spacer holding members are used.

Figure 9:
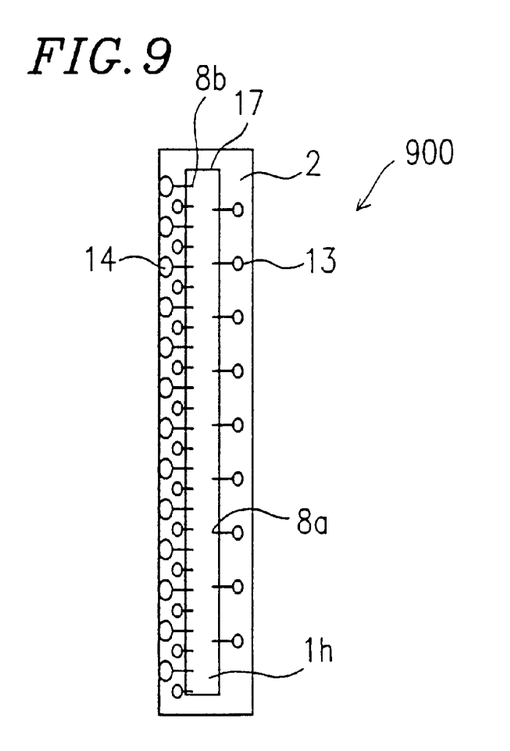
FIG. 9 is a schematic view showing the shape and the arrangement of outer leads in the case where 300 output-side outer leads are provided.

In the examples described above, 240 output-side outer leads, each having a bar-like shape, are arranged in parallel as in a normal TCP. However, a bonding pitch of the ACF cannot be reduced to less than 50 μm at present. Therefore, for a liquid crystal display panel driver having a large number of outputs, i.e., about 300 outputs, it is desirable that the outer leads, each having a circular shape or a polygonal shape, are arranged in a zig-zag pattern. Such a TCP 900 utilizing the zig-zag pattern is shown in FIG. 9.

In the examples described above, the insulating film a made of s polyimide type material is utilized. Alternatively, the insulating film 2 may be made of materials other than the polyimide type materials, for example, aramide, glass epoxy, BT resin, and polyethylene terephthalate (PET).

Furthermore, although the insulating film 2 having a width of about 1 mm is utilized In Example 7, the present invention is not limited thereto.

Although the carrier tape having a three-layered structure is utilized in the examples described above, a film carrier tape having a double-layered structure omitting an adhesive layer is applicable to fabricate the TCP having the structure of the present invention.

Furthermore, in the examples described above, all of or part of the input-side outer leads and the outer-side outer leads are positioned within a region of the semiconductor chip 1 where a device is formed. However, the position of the input-side outer leads and the output-side outer leads is not limited thereto. The same effect can be obtained as long as the input-side outer leads and the output-side outer leads are positioned on the semiconductor chip 1.

As mentioned above, according to the present invention, at least part of the input-side outer leads and the output-side outer leads or all of the input-side outer leads and output-side outer leads are arranged so as to face the bump-mounted surface of the semiconductor chip in an overlapped manner.

In the conventional structure, the frame size was equal to the total size of a length of the inner-side outer lead, a TCP wiring region between a semiconductor chip and a liquid crystal display panel, a TCP wiring region between the semiconductor chip and a printed board, a resin sealed region, and a semiconductor chip size.

With the configuration as described above, it is possible to overlap the semiconductor chip, and part of the wiring region of the TCP between the semiconductor chip and the liquid crystal display panel, and the resin sealed region, or the semiconductor chip, part of the TCP wiring region between the semiconductor chip and the printed board, the length of the input-side outer leads, and the resin sealed region. Therefore, the frame size can be reduced even with a conventional semiconductor chip size as compared with that of the conventional TCP.

Moreover, a performance test is carried out after attachment of the TCP. Therefore, it is possible to perform a burn-in test in the form of tape. Furthermore, even when the arrangement of the bumps on the semiconductor chip is changed, it is sufficient to change the arrangement of inner leads on the semiconductor chip. Therefore, the problems of the COG can be solved.

Moreover, since the insulating film and the input-side outer leads are provided on the semiconductor chip, a mechanical strength can be improved.

According to the present invention, the frame size can be reduced to improve a mechanical strength.

According to the present invention, by using the spacer holding members, the semiconductor chip and the insulating film are kept so as to form a predetermined gap therebetween. As a result, the gap between the semiconductor chip and the insulating film is sufficiently filled with a sealing resin to protect the surface of the semiconductor chip.

Furthermore, according to the present invention, a TCP is mounted on a liquid crystal display panel so that a glass substrate or a printed board of the liquid crystal display panel overlaps the semiconductor chip. As a result, the size of a liquid crystal display device can be minimized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A tape carrier package comprising:
   a semiconductor chip including a first row of electrode bumps formed on a surface of the semiconductor chip; and a second row of electrode bumps formed on the surface of the semiconductor chip parallel to the first row;
   an insulating film, at least a portion of the insulating film being formed on the semiconductor chip;
   a conductor pattern including a first lead section formed on the insulating film and connectable to an external device and a second lead section extending from the first lead section so as to electrically connect to the first and second rows of electrode bumps, wherein the first lead section is a lead section that is entirely disposed within a width of the external device, and wherein at least a part of the first lead section is positioned on the semiconductor chip; and
   a sealing resin for sealing at least a junction between the first and second rows of electrode bumps and the second lead section.

2. A tape carrier package according to claim 1, wherein the first and second rows of electrode bumps are formed in a vicinity of a first edge of the semiconductor chip.

3. A tape carrier package according to claim 1, wherein the first row of electrode bumps is formed in a vicinity of a first edge of the semiconductor chip, and the second row of electrode bumps is formed in a vicinity of a second edge of the semiconductor chip opposed to the first edge.

4. A tape carrier package according to claim 3, wherein the portion of the insulating film formed on the semiconductor chip is positioned between the first row and the second row of electrode bumps.

5. A tape carrier package according to claim 1, wherein the first and second row of electrode bumps are formed along a center of the semiconductor chip.

6. A tape carrier package according to claim 1, wherein the first row of electrode bumps is formed in a vicinity of a first edge of the semiconductor chip, and the second row of electrode bumps is formed along a center of the semiconductor chip.

7. A tape carrier package according to claim 1, wherein a spacer holding member is provided between the semiconductor chip and the insulating film so as to form a gap therebetween, the gap between the semiconductor chip and the insulating film being filled with the sealing resin.

8. A tape carrier package comprising:
   a semiconductor chip including a first row of electrode bumps formed on a surface of the semiconductor chip; and a second row of electrode bumps formed on the surface of the semiconductor chip parallel to the first row;
   an insulating film formed on the semiconductor chip;
   a conductor pattern including a first lead section formed on the insulating film and connectable to an external device and a second lead section extending from the first lead section so as to electrically connect to the first and second rows of electrode bumps, wherein the entire conductor pattern is positioned within a width of the semiconductor chip; and
   a sealing resin for sealing at least a junction between the first and second rows of electrode bumps and the second lead section.

9. A tape carrier package according to claim 8, wherein the first and second rows of electrode bumps are formed in a vicinity of a first edge of the semiconductor chip.

10. A tape carrier package according to claim 8, wherein the first row of electrode bumps is formed in a vicinity of a first edge of the semiconductor chip, and the second row of electrode bumps is formed in a vicinity of a second edge of the semiconductor chip opposed to the first edge.

11. A tape carrier package according to claim 10, wherein the insulating film is positioned between the first row and the second row of electrode bumps.

12. A tape carrier package according to claim 8, wherein the first and second rows of electrode bumps are formed along a center of the semiconductor chip.

13. A tape carrier package according to claim 8, wherein the first row of electrode bumps is formed in a vicinity of a first edge of the semiconductor chip, and the second row of electrode bumps is formed along a center of the semiconductor chip.

14. A tape carrier package according to claim 8, wherein a spacer holding member is provided between the semiconductor chip and the insulating film so as to form a gap therebetween, the gap between the semiconductor chip and the insulating film being filled with the sealing resin.

15. A liquid crystal display device comprising:
   a tape carrier package comprising
      a semiconductor chip including a first row of electrode bumps formed on a surface of the semiconductor chip; and a second row of electrode bumps formed on the surface of the semiconductor chip parallel to the first row;
      an insulating film, at least a portion of the insulating film being formed on the semiconductor chip;
      a conductor pattern including a first lead section formed on the insulating film and a second lead section extending from the first lead section so as to electrically connect to the first and second rows of electrode bumps, the first lead section being positioned on the semiconductor chip; and
   a sealing resin for sealing at least a junction between the first and second rows of electrode bumps and the second lead section, and
   a liquid crystal display panel including a glass substrate and a printed wiring board connected to the first lead section of the tape carrier package, wherein the tape carrier package is mounted onto the liquid crystal display panel so that the semiconductor chip overlaps one of the glass substrate and the printed wiring board and a part of the first lead section is connected to the printed wiring board via an anisotropic conductor film.

* * * * *